US012063027B2

(12) United States Patent
Goto et al.

(10) Patent No.: US 12,063,027 B2
(45) Date of Patent: Aug. 13, 2024

(54) ACOUSTIC WAVE DEVICE WITH CERAMIC SUBSTRATE

(71) Applicant: Skyworks Solutions, Inc., Irvine, CA (US)

(72) Inventors: Rei Goto, Osaka (JP); Hironori Fukuhara, Ibaraki (JP); Hiroyuki Nakamura, Osaka-Fu (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 857 days.

(21) Appl. No.: 16/680,136

(22) Filed: Nov. 11, 2019

(65) Prior Publication Data
US 2020/0162053 A1    May 21, 2020

Related U.S. Application Data

(60) Provisional application No. 62/770,644, filed on Nov. 21, 2018.

(51) Int. Cl.
 | | |
 |---|---|
 | H03H 9/02 | (2006.01) |
 | H03H 9/58 | (2006.01) |
 | H03H 9/05 | (2006.01) |

(52) U.S. Cl.
CPC ........ *H03H 9/02574* (2013.01); *H03H 9/581* (2013.01); *H03H 9/058* (2013.01)

(58) Field of Classification Search
CPC ............................ H03H 9/02574; H03H 9/058
USPC ...... 310/313 R, 313 A, 313 B, 313 C, 313 D
See application file for complete search history.

(56) References Cited

U.S. PATENT DOCUMENTS

| | | |
|---|---|---|
| 3,955,160 A | 5/1976 | Duffy |
| 5,233,259 A | 8/1993 | Kirshnaswamy et al. |
| 6,242,844 B1 | 6/2001 | Puttagunta et al. |
| 6,510,597 B2 | 1/2003 | Yoshida et al. |
| 6,555,946 B1 | 4/2003 | Finder et al. |
| 7,105,980 B2 | 9/2006 | Abbott et al. |
| 7,439,649 B2 | 10/2008 | Fujii et al. |
| 7,510,906 B2 | 3/2009 | Chang et al. |

(Continued)

FOREIGN PATENT DOCUMENTS

| | | |
|---|---|---|
| CN | 112787620 | 5/2021 |
| JP | 2002-016468 | 1/2002 |

(Continued)

OTHER PUBLICATIONS

Geshi et al., "Wafer Bonding of Polycrystalline Spinel with $LiNbO_3$/$LiTaO_3$ for Temperature Compensation of RF Surface Acoustic Wave Devices", SEI Technical Review, No. 75, pp. 116-119, Oct. 2012.

(Continued)

*Primary Examiner* — Derek J Rosenau
(74) *Attorney, Agent, or Firm* — Knobbe, Martens, Olson & Bear, LLP

(57) ABSTRACT

A surface acoustic wave device is disclosed. The surface acoustic wave device can include a ceramic substrate, a piezoelectric layer over the ceramic substrate, and an interdigital transducer electrode over the piezoelectric layer. The ceramic substrate can be a polycrystalline spinel substrate. The surface acoustic wave device can also include a temperature compensating layer over the interdigital transducer electrode.

20 Claims, 14 Drawing Sheets

(56) References Cited

U.S. PATENT DOCUMENTS

| | | | |
|---|---|---|---|
| 8,258,895 B2* | 9/2012 | Ruile | H03H 9/0222 333/195 |
| 8,373,329 B2 | 2/2013 | Nakahashi | |
| 8,614,535 B2 | 12/2013 | Tsuji et al. | |
| 9,246,533 B2 | 1/2016 | Fujiwara et al. | |
| 9,276,558 B2 | 3/2016 | Kando | |
| 9,484,886 B2 | 11/2016 | Takemura | |
| 9,520,857 B2 | 12/2016 | Fujiwara et al. | |
| 10,389,332 B2 | 8/2019 | Bhattacharjee | |
| 10,700,662 B2 | 6/2020 | Miura et al. | |
| 10,749,497 B2 | 8/2020 | Tang et al. | |
| 10,778,187 B2 | 9/2020 | Takamine et al. | |
| 10,886,891 B2 | 1/2021 | Kuroyanagi et al. | |
| 11,245,378 B2 | 2/2022 | Tang et al. | |
| 11,258,427 B2 | 2/2022 | Kadota et al. | |
| 11,356,075 B2 | 6/2022 | Kadota et al. | |
| 11,621,690 B2 | 4/2023 | Fukuhara et al. | |
| 11,876,501 B2 | 1/2024 | Fukuhara et al. | |
| 2005/0151599 A1 | 7/2005 | Ido et al. | |
| 2005/0162595 A1 | 7/2005 | Kondo et al. | |
| 2006/0243982 A1 | 11/2006 | Chang et al. | |
| 2007/0296304 A1 | 12/2007 | Fujii et al. | |
| 2007/0296306 A1* | 12/2007 | Hauser | H03H 3/10 310/313 R |
| 2009/0189483 A1 | 7/2009 | Kadota et al. | |
| 2012/0231218 A1 | 9/2012 | Nakayama et al. | |
| 2013/0026881 A1* | 1/2013 | Okamoto | H03H 9/0222 310/313 C |
| 2015/0325775 A1 | 11/2015 | Shimizu | |
| 2017/0279435 A1* | 9/2017 | Geshi | B32B 9/04 |
| 2017/0353173 A1 | 12/2017 | Sakurai et al. | |
| 2018/0034439 A1 | 2/2018 | Ruby et al. | |
| 2018/0102760 A1 | 4/2018 | Inoue et al. | |
| 2018/0109241 A1 | 4/2018 | Inoue et al. | |
| 2018/0175275 A1 | 6/2018 | Nishihara et al. | |
| 2019/0068161 A1 | 2/2019 | Kimura | |
| 2019/0074819 A1 | 3/2019 | Goto et al. | |
| 2019/0123713 A1 | 4/2019 | Daimon | |
| 2019/0260563 A1 | 8/2019 | Yang | |
| 2019/0296713 A1 | 9/2019 | Bhattacharjee | |
| 2019/0326878 A1 | 10/2019 | Kakita et al. | |
| 2019/0379347 A1 | 12/2019 | Goto et al. | |
| 2019/0379348 A1 | 12/2019 | Tang et al. | |
| 2020/0091891 A1 | 3/2020 | Geshi et al. | |
| 2020/0106420 A1* | 4/2020 | Kodama | H03H 9/131 |
| 2020/0119710 A1 | 4/2020 | Kadota et al. | |
| 2020/0119711 A1 | 4/2020 | Kadota et al. | |
| 2020/0212878 A1 | 7/2020 | Shin et al. | |
| 2020/0212882 A1 | 7/2020 | Shin et al. | |
| 2020/0212884 A1 | 7/2020 | Shin et al. | |
| 2020/0212891 A1 | 7/2020 | Daimon | |
| 2020/0274513 A1 | 8/2020 | Fukuhara et al. | |
| 2020/0274517 A1 | 8/2020 | Fukuhara et al. | |
| 2021/0067131 A1 | 3/2021 | Tang et al. | |
| 2021/0075389 A1 | 3/2021 | Belhachemi et al. | |
| 2021/0159883 A1 | 5/2021 | Kadota et al. | |
| 2022/0123712 A1 | 4/2022 | Tang et al. | |
| 2022/0200566 A1 | 6/2022 | Kadota et al. | |
| 2022/0368311 A1 | 11/2022 | Shin et al. | |

FOREIGN PATENT DOCUMENTS

| | | |
|---|---|---|
| JP | 2006-180334 | 7/2006 |
| JP | 4186300 | 11/2008 |
| JP | 2009-094661 | 4/2009 |
| JP | 2011-066818 | 3/2011 |
| JP | 2017-022501 | 1/2017 |
| JP | 2016-100744 | 3/2019 |
| RU | 2336372 | 10/2007 |

OTHER PUBLICATIONS

Shim et al., "RF MEMS Passives on High-Resistivity Silicon Substrates", IEEE Microwave and Wireless Components Letters, 2013.

Ftouni et al., "Thermal conductivity of silicon nitride membranes is not sensitive to stress", American Physical Society, vol. 92(12):125439 (2015).

Linseis, "LFA 1000-Aluminum Oxide Al2)3-Thermal diffusivity/conductivity", 2000.

Petit et al., "Processing of highly transparent spinel ceramics for high thermo-mechanical resistance window applications", Advanced Solid-State Lasers Congress Technical Digest, OSA 2013.

Sarabalis et al., "Acousto-optic modulation in lithium niobate on sapphire", published online Aug. 12, 2020, in APL Photonics.

* cited by examiner

ACOUSTIC WAVE DEVICE WITH CERAMIC SUBSTRATE

CROSS REFERENCE TO PRIORITY APPLICATION

This application claims the benefit of priority of U.S. Provisional Patent Application No. 62/770,644, filed Nov. 21, 2018 and titled "ACOUSTIC WAVE RESONATOR WITH SPINEL SUBSTRATE," the disclosure of which is hereby incorporated by reference in its entirety herein.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a surface acoustic wave device is disclosed. The surface acoustic wave device includes a ceramic substrate, a piezoelectric layer over the ceramic substrate, an interdigital transducer electrode over the piezoelectric layer, and a temperature compensating layer over the interdigital transducer electrode. The surface acoustic wave device can be configured to generate a surface acoustic wave.

In an embodiment, the ceramic substrate is a polycrystalline spinel substrate. A surface of the polycrystalline spinel substrate can have a maximum roughness of 2 nanometers or less. A surface of the polycrystalline spinel substrate can have an average roughness of 1 nanometers or less.

In an embodiment, the surface acoustic wave has a wavelength of $\lambda$, and the piezoelectric layer has a thickness in a range from $3\lambda$, to $20\lambda$. The thickness of the piezoelectric layer can be at least $5\lambda$.

In an embodiment, the temperature compensating layer is a silicon dioxide layer.

In an embodiment, the interdigital transducer electrode includes two layers. One of the two layers can include aluminum. The other of the two layers can include molybdenum.

In an embodiment, the piezoelectric layer includes lithium niobate.

In an embodiment, the surface acoustic wave device further includes an adhesion layer positioned between the ceramic substrate and the piezoelectric layer. The adhesion layer can include an oxide layer. The Oxide layer can include silicon dioxide.

In an embodiment, the temperature compensating layer can include a silicon dioxide layer.

In another aspect, a surface acoustic wave device is disclosed. The surface acoustic wave device includes a ceramic substrate, a piezoelectric layer over the ceramic substrate, and an interdigital transducer electrode over the piezoelectric layer. The surface acoustic wave device can be configured to generate a surface acoustic wave having a wavelength $\lambda$. The piezoelectric layer can have a thickness in a range from $3\lambda$, to $20\lambda$.

In an embodiment, the ceramic substrate is a polycrystalline spinel substrate.

In an embodiment, the thickness of the piezoelectric layer is at least $5\lambda$.

In an embodiment, a surface of the ceramic substrate has a maximum roughness of 2 nanometers or less. A surface of the ceramic substrate can have an average roughness of 1 nanometers or less.

In an embodiment, the surface acoustic wave device further includes a temperature compensating layer over the interdigital transducer electrode. The temperature compensating layer can be a silicon dioxide layer.

In an embodiment, the interdigital transducer electrode includes two layers. One of the two layers can include aluminum. The other of the two layers can include molybdenum.

In an embodiment, the piezoelectric layer includes lithium niobate.

In an embodiment, the surface acoustic wave device further include an adhesion layer between the ceramic substrate and the piezoelectric layer. The adhesion layer can include an oxide layer. The Oxide layer can include silicon dioxide.

In another aspect, a surface acoustic wave filter is disclosed. The surface acoustic wave filter includes a surface acoustic wave resonator. The surface acoustic wave resonator can include a ceramic substrate, a piezoelectric layer over the ceramic substrate, an interdigital transducer electrode over the piezoelectric layer, and a temperature compensating layer over the interdigital transducer electrode. The surface acoustic wave filter also includes a plurality of additional acoustic wave resonators. The surface acoustic wave resonator and the additional acoustic wave resonators can be arranged to filter a radio frequency signal.

In an embodiment, a front end module includes the surface acoustic wave filter, other circuitry, and a package enclosing the surface acoustic wave filter and the other circuitry. The front end module can also include a multi-throw radio frequency switch. The front end module can further include a power amplifier.

In an embodiment, a wireless communication device includes an antenna and the surface acoustic wave filter. The surface acoustic wave filter can be arranged to filter a radio frequency signal associated with the antenna.

In one aspect, a method of manufacturing surface acoustic wave resonators is disclosed. The method includes smoothing a polycrystalline spinel substrate such that a surface of the polycrystalline substrate has a maxim roughness of 2 nanometers or less. The method also includes bonding a piezoelectric layer of a surface acoustic wave resonator to the surface of the polycrystalline spinel substrate. The method further includes forming a interdigital transducer electrode over the piezoelectric layer.

In an embodiment, the surface of the polycrystalline spinel substrate has an average roughness of 1 nanometer or less.

In an embodiment, the smoothing includes chemical-mechanical polishing.

In an embodiment, the bonding is direct bonding.

In an embodiment, the surface acoustic wave resonator includes any suitable combination of features of the above embodiments.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
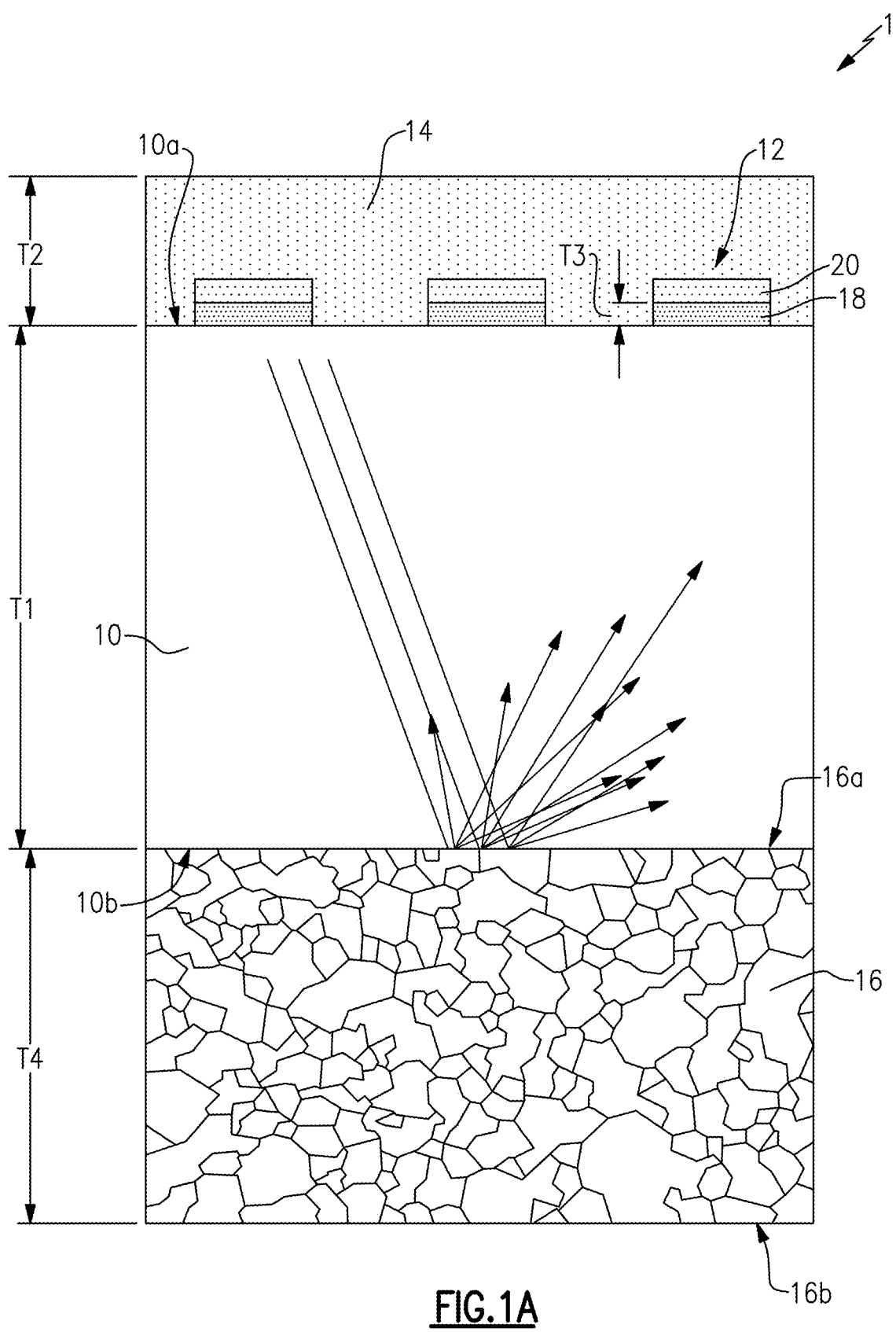
FIG. 1A illustrates a cross section of a surface acoustic wave resonator that includes a polycrystalline spinel layer according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double-mode SAW (DMS) filters). Although embodiments may be discussed with reference to SAW resonators, the principles and advantages discussed herein can be applied to any suitable SAW device and/or any suitable acoustic wave device.

Acoustic wave filters can include SAW resonators that include a multi-layer piezoelectric substrate. Multi-layer piezoelectric substrates can provide good thermal dissipation characteristics and improved temperature coefficient of frequency (TCF) relative to certain single layer piezoelectric substrates. For example, a SAW resonator with a piezoelectric layer on a high impedance support substrate, such as silicon, can achieve better temperature coefficient of frequency (TCF) and thermal dissipation compared to a similar device without the high impedance support substrate.

For example, a SAW resonator can include a silicon dioxide ($SiO_2$) layer, a lithium niobate (LN) piezoelectric layer, an interdigital transducer (IDT) over the LN piezoelectric layer, and a high impedance support substrate (e.g., a silicon substrate) under the LN piezoelectric layer. Such resonators with the high impedance substrate can be beneficial for obtaining a better TCF and/or a better thermal dissipation characteristic than temperature compensated (TC) SAW resonators that do not include the high impedance substrate structure.

However, SAW resonators that include a piezoelectric layer on certain high impedance support substrates can experience spurious responses as a result of back reflection from the high impedance support substrate. This can degrade a frequency response of a filter that includes the SAW resonators.

Aspects of this disclosure relate to SAW resonators that include a ceramic support substrate (e.g., a polycrystalline spinel support substrate). The ceramic support substrate can scatter back reflections by a beam scattering feature of the ceramic support substrate. The ceramic support substrate can have desirable flatness characteristics. The ceramic support substrate can be directly bonded to a piezoelectric layer without an intervening adhesive relatively easily. The ceramic support substrate can also achieve advantages of other high impedance support substrates, such as improved TCF and/or desirable thermal dissipation.

Embodiments of a SAW resonator disclosed herein include a ceramic support substrate (e.g., a polycrystalline spinel as a support substrate). Disclosed SAW resonators include a polycrystalline spinel substrate, a piezoelectric layer over the polycrystalline spinel substrate, and an IDT electrode over the piezoelectric layer. In some embodiments, the SAW resonator includes a temperature compensating layer over the interdigital transducer electrode. The temperature compensating layer can also be referred to as a temperature compensation layer. The SAW resonators disclosed herein can help with filtering radio frequency signals in carrier aggregation applications. Various embodiments of the SAW resonator disclosed herein can be implemented in an acoustic wave filter for filtering a radio frequency signal in any suitable frequency band. Such acoustic wave filters can be for low band, mid band, and/or high band applications.

FIG. 1A illustrates a cross section of a surface acoustic wave resonator 1 according to an embodiment. The illustrated SAW resonator 1 includes an LN layer 10, IDT electrodes 12 over the LN layer 10, $SiO_2$ layer 14 over the IDT electrodes 12, and a ceramic support substrate (e.g., a polycrystalline spinel substrate 16) below the LN layer 10. The LN layer 10 may be substituted with any other suitable piezoelectric layer (e.g., a lithium tantalate (LT) layer). Alternatively or additionally, the $SiO_2$ layer 14 may be substituted with any other suitable temperature compensation layer. The temperature compensating layer can be a layer of any other suitable material having a positive temperature coefficient of frequency. For instance, the temperature compensating layer can be a tellurium dioxide ($TeO_2$) layer or a silicon oxyfluoride (SiOF) layer in certain applications. A temperature compensating layer can include any suitable combination of $SiO_2$, $TeO_2$, and/or SiOF. In some embodiments, for example, as explained with respect to FIG. 2A, a temperature compensation layer (e.g., the $SiO_2$ 14 of FIG. 1A) may be omitted. The surface acoustic wave resonator 1 can use Rayleigh waves. Accordingly, a LN layer 10 as a piezoelectric layer can be advantageous in certain applications.

The polycrystalline spinel substrate 16 can be a magnesium aluminate ($MgAl_2O_4$) spinel. The polycrystalline spinel substrate 16 can be replaced with any suitable ceramic substrate. A ceramic substrate can include, for example, polycrystalline spinel (e.g., $MgAl_2O_4$), co-fired ceramic, or polycrystalline aluminum nitride (AlN). The ceramic substrate can have higher acoustic impedance than an acoustic impedance of the LN layer 10.

Ceramics, such as polycrystalline spinel, are good wave scattering materials. Accordingly, a ceramic substrate, such as the polycrystalline spinel substrate 16, can scatter waves at a diffraction boundary between the polycrystalline spinel layer 16 and the LN layer 10 of the surface acoustic wave resonator 1. With the back scattering of the polycrystalline spinel layer 16, spurious modes resulting from back scattering can be suppressed. This can avoid and/or mitigate degradation of a frequency response of a filter that includes the SAW resonator 1. The polycrystalline spinel substrate 16 can have desirable flatness and/or smoothness at the diffraction boundary between the polycrystalline spinel layer 16 and the LN layer 10 (e.g., an upper surface 16a). The polycrystalline spinel substrate 16 can achieve desirable diffraction while being relatively smooth. For instance, the polycrystalline spinel substrate 16 can have a smoothness in a range from about 0.1 nanometer (nm) to 2 nm. This is unlike some other high impedance support substrates that can create spurious responses as a result of back reflection when they are relatively smooth. The polycrystalline spinel substrate 16 can be bonded to the LN layer 10 relatively easily. The polycrystalline spinel substrate 16 can be directly bonded to the LN layer 10 without an intervening adhesive. There can be little or no delamination of the polycrystalline spinel substrate 16 and the LN layer 10 after bonding.

The polycrystalline spinel substrate 16 has a thickness T4. The thickness T4 of the polycrystalline spinel substrate 16 can be any suitable thickness. In some embodiments, the thickness T4 can be determined by a desired overall dimension of the SAW resonator 1. The thickness T4 of the polycrystalline spinel substrate 16 can be sufficiently thick to maintain structural integrity of a surface acoustic wave device. For example, the thickness T4 of the polycrystalline spinel substrate 16 can be at least 100 μm. Such a thickness can maintain structural integrity of the surface acoustic wave resonator 1. In some embodiments, the thickness T4 of the polycrystalline spinel substrate 16 can be in a range from 100 μm to 500 μm.

The IDT electrode 12 illustrated in FIG. 1A includes a plurality of metal layers. The IDT electrode 12 can include a molybdenum (Mo) layer 18 and an aluminum (Al) layer 20. The IDT electrode 12 may include other metals, such as, copper (Cu), Magnesium (Mg), titanium (Ti), etc. The IDT electrode 12 may include alloys, such as AlMgCu, AlCu, etc. The polycrystalline spinel substrate 16 can reduce the back reflection compared to other support substrates, such as a silicon substrate, a sapphire substrate, or the like.

The LN layer 10 has a thickness T1. The thickness T1 of the LN layer 10 can be selected based on a wavelength λ or L of a surface acoustic wave generated by the surface acoustic wave resonator 1. The IDT electrode 12 has a pitch that sets the wavelength λ or L of the surface acoustic wave device 1. The LN layer 10 can be sufficiently thick to avoid significant frequency variation. A thickness T1 of the LN layer 10 of at least 3L can be sufficiently thick to mitigation frequency variation due to a relatively thin LN layer 10. The thickness T1 of the LN layer 10 can be in a range of, for example, 3L to 20L. In some instances, the thickness T1 of the LN layer 10 can be at least 5L, such as in a range from 5L to 20L. The wavelength L of the surface acoustic wave can be, for example, 4 μm and the thickness T1 of the LN layer 10 can be, for example 20 μm, in some embodiments. As noted above, the LN layer 10 may be substituted with any other suitable piezoelectric layer (e.g., a lithium tantalate (LT) layer).

The SiO$_2$ layer 14 can bring the TCF of the surface acoustic wave resonator 1 closer to zero to thereby provide temperature compensation. The SiO$_2$ layer 14 can improve the electromechanical coupling coefficient k$^2$ of the SAW resonator 1 relative to a similar SAW resonator without the SiO$_2$ layer 14. This advantage of the SiO$_2$ layer 14 can be more pronounced when the piezoelectric layer includes the LN layer 10. The SiO$_2$ layer 14 has a thickness T2. In some embodiments, the thickness T2 of the SiO$_2$ layer 14 can be in a range from 0.1L to 0.5L. For example, when the wavelength L is 4 μm, the thickness T2 of the SiO$_2$ layer 14 can be 1200 nm.

The Mo layer 18 of the IDT electrodes 12 has a thickness T3. In some embodiments, the thickness T3 of the Mo layer 18 can be about 0.05L. For example, when the wavelength L is 4 μm, the thickness T3 of the Mo layer 18 can be 200 nm.

In some embodiments, the thickness T1 of the LN layer 10 may be adjusted by grinding from an upper surface 10a of the LN layer 10 after bonding a lower surface 10b of the LN layer 10 and an upper surface 16a the polycrystalline spinel substrate 16. The LN layer 10 and the polycrystalline spinel substrate 16 can be directly bonded without an intervening adhesive. The lower surface 10b of the LN layer 10 and the upper surface 16a the polycrystalline spinel substrate 16 can be subjected to an appropriate preparation for such direct bonding. The preparation of the surfaces 10b and 16a can include smoothing the surfaces 10b and/or 16a, for example, as discussed with reference to FIG. 5A. The SiO$_2$ layer 14 can be formed over the upper surface 10a of the LN layer 10. The polycrystalline spinel substrate 16 can be thinned by, for example, grinding from a lower surface 16b of the polycrystalline spinel substrate 16.

Figure 1B:
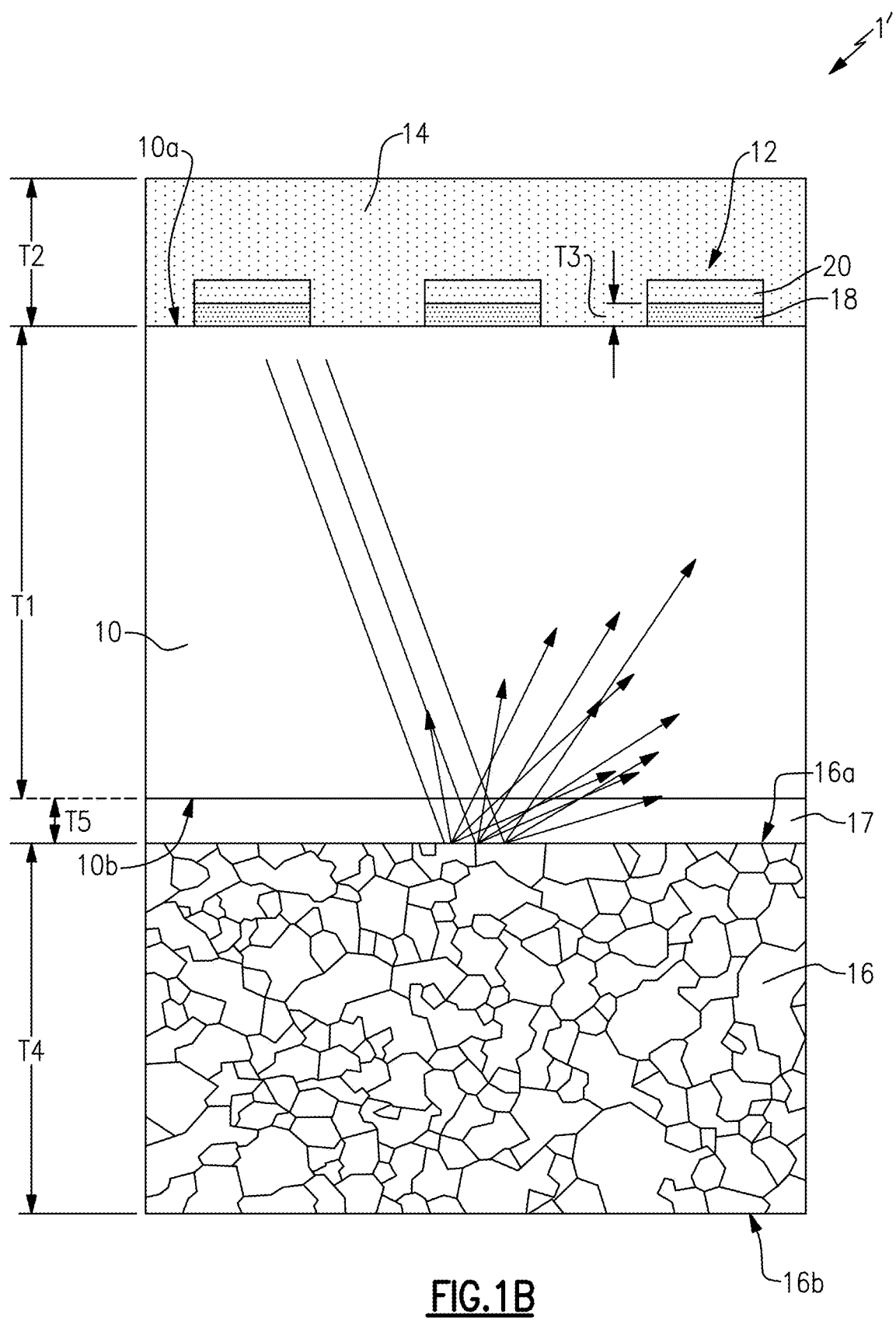
FIG. 1B illustrates a cross section of a surface acoustic wave resonator that includes a polycrystalline spinel layer according to another embodiment.

FIG. 1B illustrates a cross section of a surface acoustic wave resonator 1' according to another embodiment. The surface acoustic wave resonator 1' is like the surface acoustic wave resonator 1 of FIG. 1A, except that the SAW resonator 1' illustrated in FIG. 1B includes an intermediate layer 17. The illustrated SAW resonator 1' includes an LN layer 10, IDT electrodes 12 over the LN layer 10, a SiO$_2$ layer 14 over the IDT electrodes 12, a ceramic substrate (e.g., a polycrystalline spinel substrate 16) below the LN layer 10, and the intermediate layer 17 between the LN layer 10 and the polycrystalline spinel substrate 16. Unless otherwise noted, components shown in FIG. 1B may be the same as or generally similar to like numbered components in FIG. 1A.

The intermediate layer 17 can act as an adhesive layer, in some embodiments. The intermediate layer 17 can include any suitable material. The intermediate layer 17 can be, for example, an oxide layer (e.g., silicon dioxide (SiO$_2$)). When the intermediate layer 17 is present, the surfaces 10b and/or 16a of the LN layer 10 and the polycrystalline spinel substrate 16, respectively, may not be smoothed.

The intermediate layer 17 has a thickness T5. The thickness T5 of the intermediate layer 17 can be in a range from, for example, 10 nm to 2 μm. The thickness T5 of the intermediate layer 17 can be in a range from, for example, 10 nm to 1 μm.

Figure 2A:
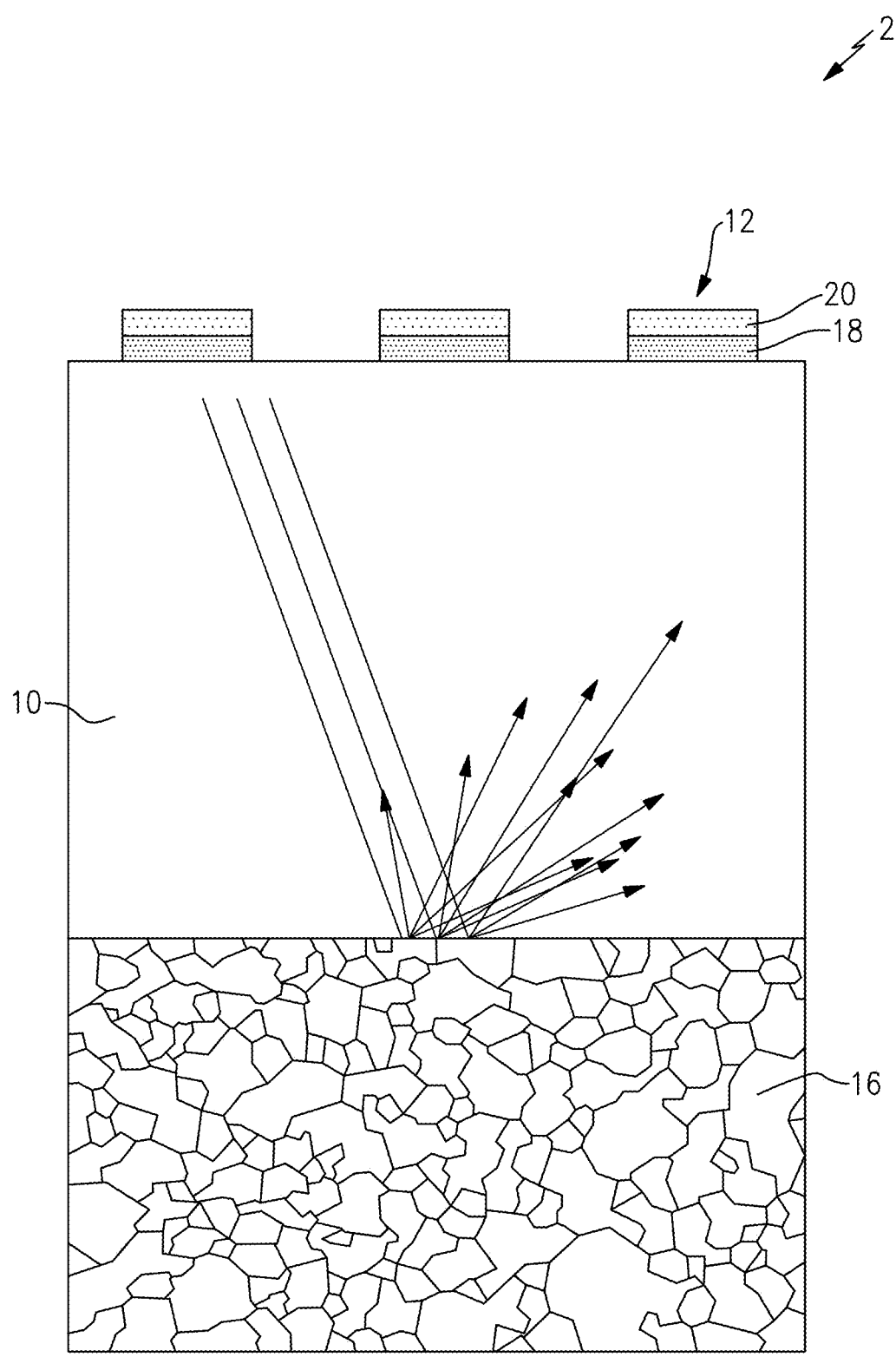
FIG. 2A illustrates a cross section of a surface acoustic wave resonator that includes a polycrystalline spinel layer according to another embodiment.

FIG. 2A illustrates a cross section of a surface acoustic wave resonator 2 according to another embodiment. The illustrated SAW resonator 2 includes an LN layer 10, IDT electrodes 12 over the LN layer 10, and a ceramic substrate (e.g., a polycrystalline spinel substrate 16) below the LN layer 10. Unless otherwise noted, components shown in FIG. 2A may be the same as or generally similar to like numbered components in FIG. 1A. The surface acoustic wave resonator 2 is like the surface acoustic wave resonator 1 of FIG. 1A, except that the SAW resonator 2 illustrated in FIG. 2A does not include the SiO$_2$ layer 14. The back scattering of the polycrystalline spinel layer 16 may be unaffected by the absence of the SiO$_2$ layer 14 of the SAW resonator 1 illustrated in FIG. 1A. The polycrystalline spinel substrate 16 can be relatively smooth and have any features of surface roughness described with reference to the smoothing of the process of FIG. 5A.

In the surface acoustic wave resonator 2, the LN layer 10 can be substituted with any other suitable piezoelectric layer (e.g., a lithium tantalate (LT) layer). For example, an LT layer having a cut angle in a range from 36° to 50° can be implemented in place of the LN layer 10 in the surface acoustic wave resonator 2. In certain embodiments, an LT layer with a cut angle of 42° may be preferable. The IDT electrode 12 illustrated in FIG. 2A includes a plurality of metal layers. The IDT 12 can include aluminum and/or an alloy such as AlMgCu, AlCu, or the like. In certain embodiments, the IDT electrode 12 can include a titanium (Ti) for improving adhesion and/or power durability of the IDT electrode 12 to a piezoelectric layer, such as the LN layer 10 or an LT layer. The IDT electrode 12 can have a thickness in a range from about 0.05λ to 0.10λ, for example.

Figure 2B:
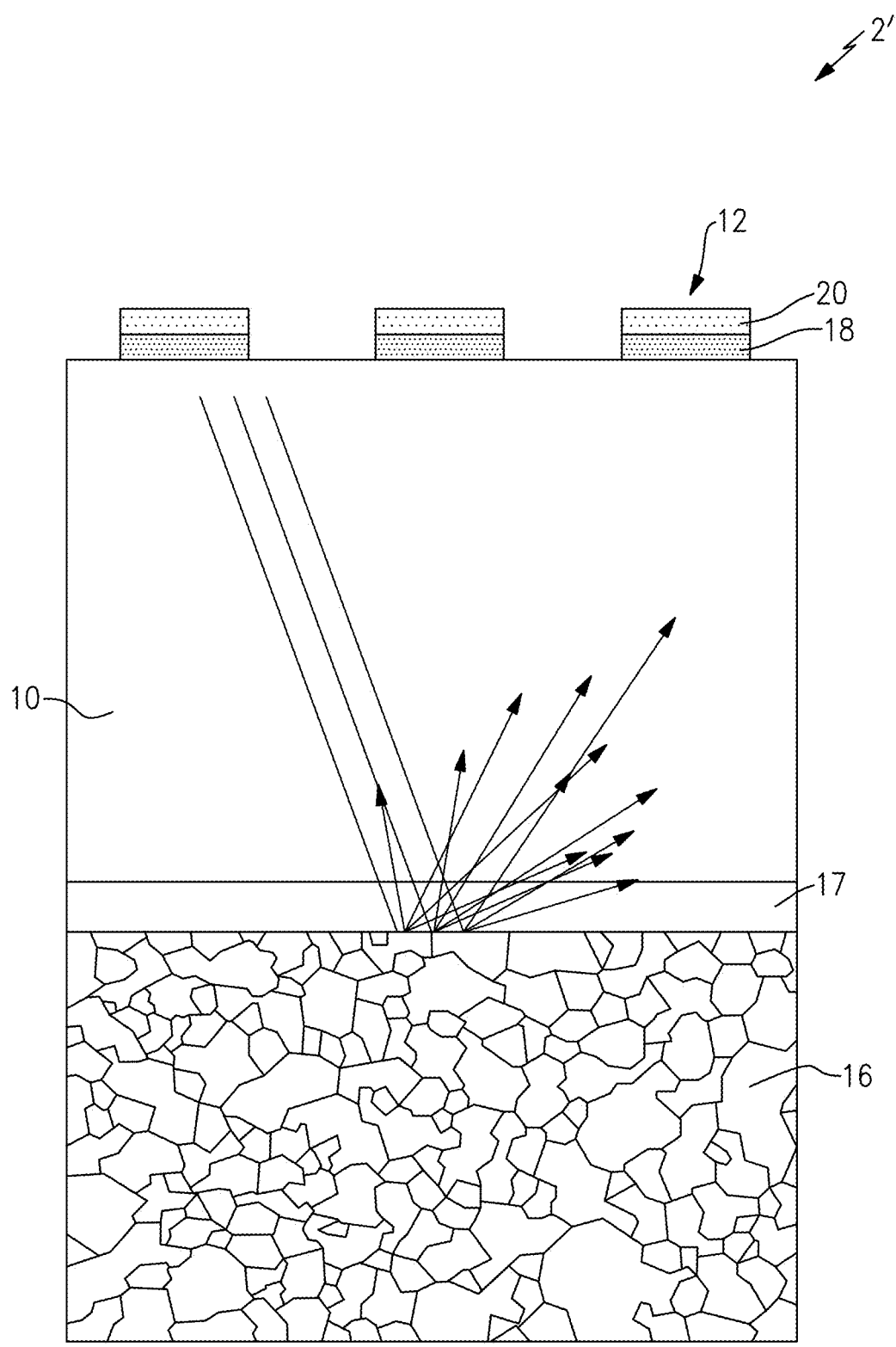
FIG. 2B illustrates a cross section of a surface acoustic wave resonator that includes a polycrystalline spinel layer according to another embodiment.

FIG. 2B illustrates a cross section of a surface acoustic wave resonator 2' according to another embodiment. The surface acoustic wave resonator 2' is like the surface acoustic wave resonator 2 of FIG. 2A, except that the SAW resonator 2' illustrated in FIG. 2B includes an intermediate layer 17. The illustrated SAW resonator 2' includes an LN layer 10, IDT electrodes 12 over the LN layer 10, a ceramic substrate (e.g., a polycrystalline spinel substrate 16) below the LN layer 10, and the intermediate layer 17 between the LN layer 10 and the polycrystalline spinel substrate 16. Unless otherwise noted, components shown in FIG. 2B may be the same as or generally similar to like numbered components in FIGS. 1A and 2A.

Figure 3A:
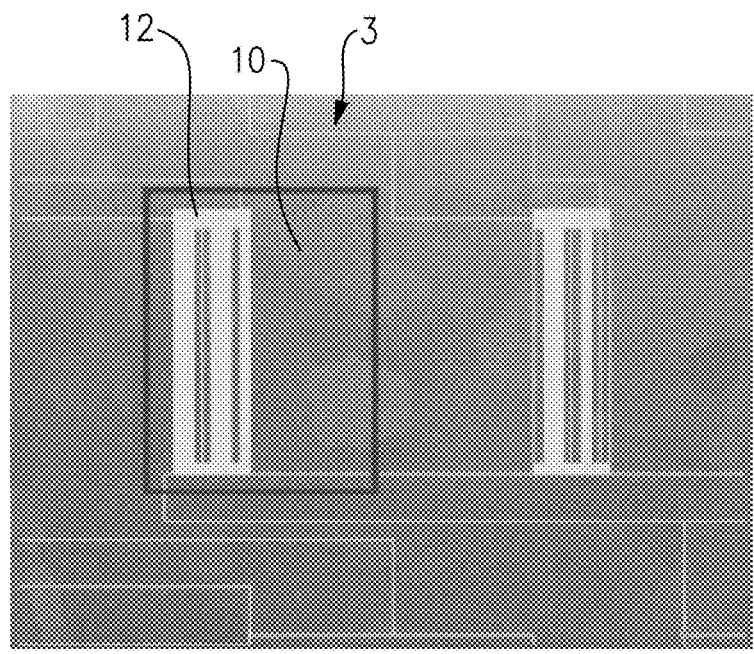
FIG. 3A is a top plan view of a surface acoustic wave resonator according to an embodiment.
Figure 3B:
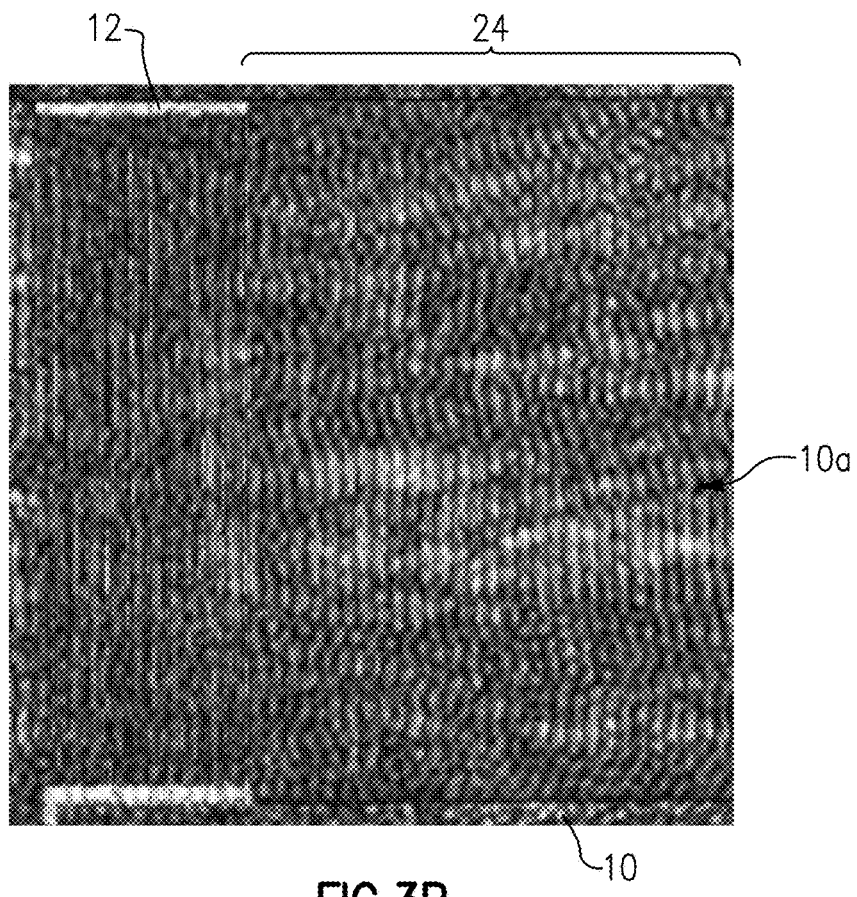
FIG. 3B illustrates a zoomed-in view of a portion near an interdigital transducer electrode of the surface acoustic wave resonator of FIG. 3A observed by a laser prober.

FIG. 3A is a top plan view of a SAW resonator 3 having IDT electrodes 12 on a piezoelectric layer (e.g., an LN layer 10). The SAW resonator 3 can have the same or generally similar structure as the SAW resonator 1, 1', 2 or 2' illustrated in FIGS. 1A, 1B, 2A and 2B, respectively. FIG. 3B illustrates a zoomed-in view of a portion near the IDT electrode 12 of FIG. 3A observed by a laser prober.

As shown in FIG. 3B, a beam scattering area 24 of an upper surface 10a of the LN layer 10 has a wavy or an irregular pattern indicative of wave scattering at the upper surface 16a of the polycrystalline spinel substrate 16 below the LN layer 10 (see FIGS. 1A, 1B, 2A and 2B). Such wave scattering can reduce the back reflection of the wave at the upper surface 16a of the polycrystalline spinel substrate 16, which can, in turn, improve high frequency attenuations.

Figure 4A:
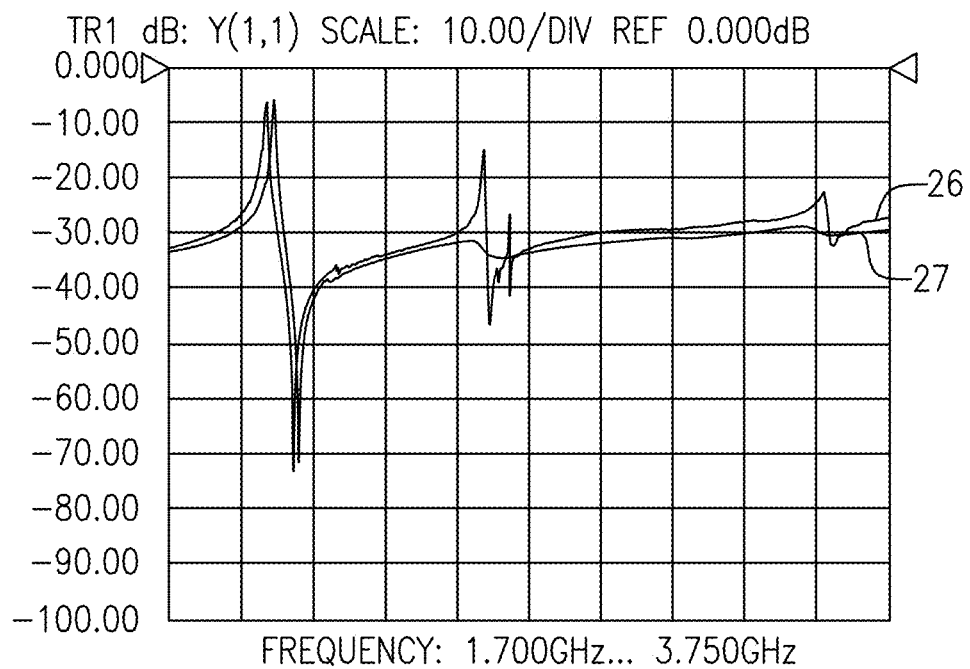
FIG. 4A is a graph showing measurement results of admittance of two SAW resonators.
Figure 4B:
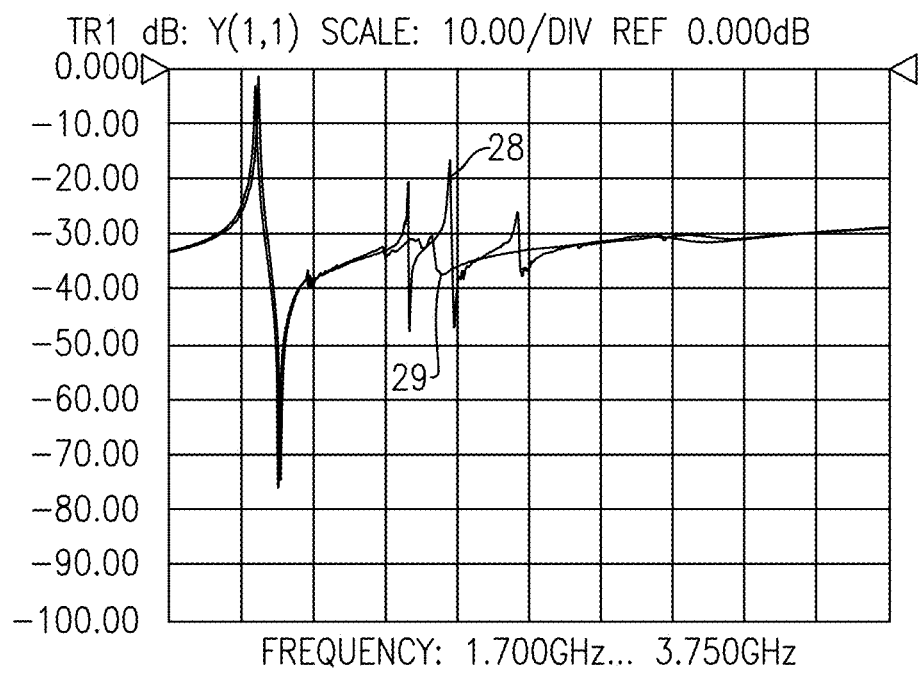
FIG. 4B is another graph showing measurement results of admittance of two SAW resonators.

FIGS. 4A and 4B are graphs showing measurement results of admittance of SAW resonators. FIG. 4A shows an admittance curve 26 for a SAW resonator that includes a lithium tantalate (LT) piezoelectric layer and a sapphire support substrate below the LT layer. FIG. 4A also shows an admittance curve 27 for the SAW resonator 2 illustrated in FIG. 2A that includes an LN layer 10, IDT electrodes 12 over the LN layer 10, and a polycrystalline spinel substrate 16 below the LN layer 10. A comparison between the admittance curve 26 and the admittance curve 27 indicates that the back reflection is suppressed by the polycrystalline spinel substrate 16.

FIG. 4B shows an admittance curve 28 for a SAW resonator that includes a lithium tantalate (LT) piezoelectric layer, a sapphire support substrate below the LT layer, and a silicon dioxide ($SiO_2$) layer between the LT layer and the sapphire support substrate. FIG. 4B also shows an admittance curve 29 for the SAW resonator 2' illustrated in FIG. 2B that includes an LN layer 10, IDT electrodes 12 over the LN layer 10, a polycrystalline spinel substrate 16 below the LN layer 10, and a silicon dioxide ($SiO_2$) layer 17 between the LT layer 10 and the polycrystalline spinel substrate 16. A comparison between the admittance curve 28 and the admittance curve 29 indicates that the back reflection is suppressed by the polycrystalline spinel substrate 16 even with the $SiO_2$ layer present.

Figure 5A:
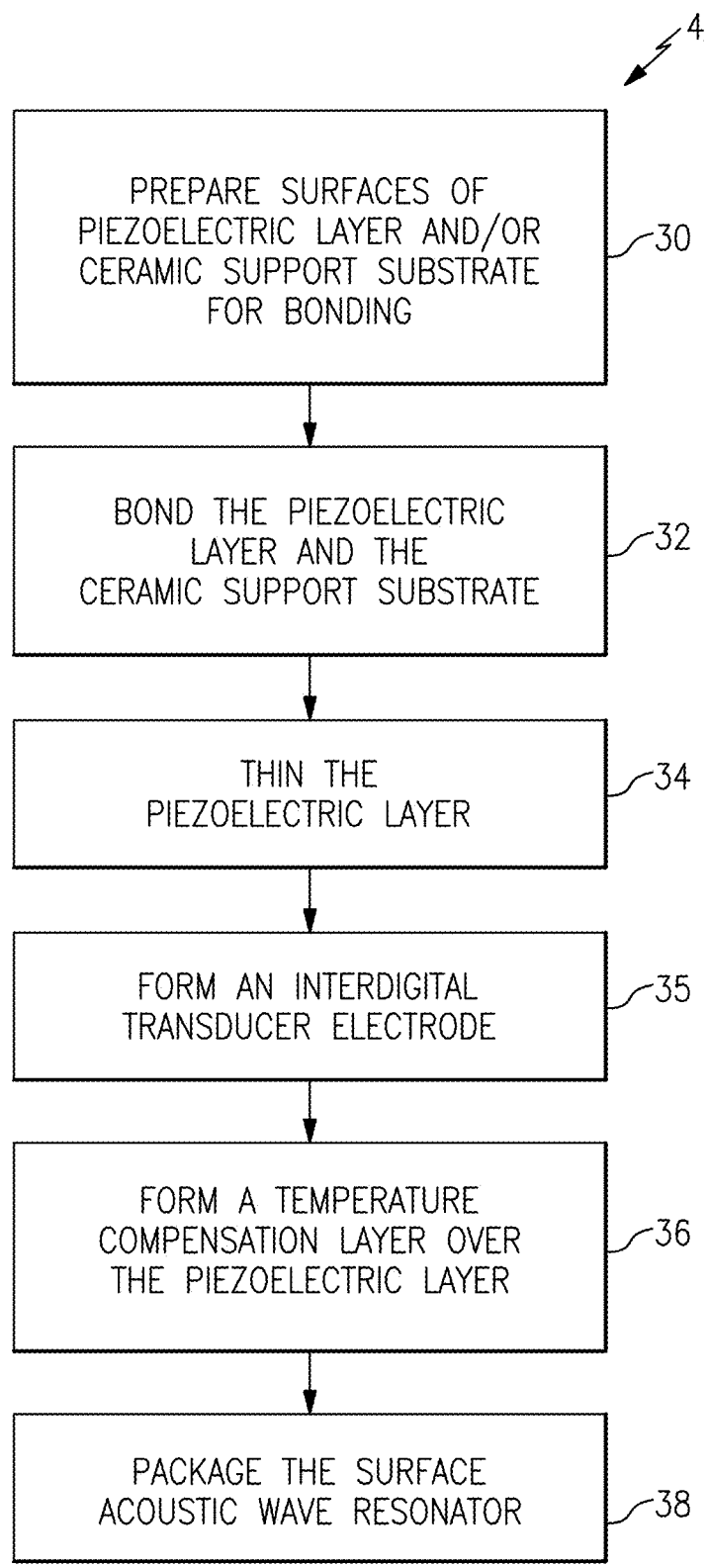
FIG. 5A is a flowchart that illustrates a manufacturing process of forming a surface acoustic wave resonator according to an embodiment.

FIG. 5A is a flowchart that illustrates a manufacturing process 4 of forming a SAW resonator. The manufacturing process 4 will now be discussed referring to FIGS. 1A and 5A and taking the embodiment of the SAW resonator 1 illustrated in FIG. 1A as an example. Some or all of the manufacturing process 4 can be used to fabricate any suitable SAW resonator with a ceramic support substrate (e.g., a polycrystalline spinel substrate). The operations of the manufacturing process 4 can be performed in any suitable order. For example, one or more of operations illustrated in FIG. 5A may be performed in a different order or sequence than illustrated.

The manufacturing process 4 includes a preparing operation 30 of preparing a surface of a piezoelectric layer and/or a ceramic support substrate (e.g., a polycrystalline spinel layer) for bonding. The lower surface 10b of the LN layer 10 and the upper surface 16a of the polycrystalline spinel layer 16 can be prepared for direct bonding. The preparation can include smoothing the surfaces 10b and/or 16a by way of, for example, chemical-mechanical polishing (CMP). For instance, the upper surface 16a of the polycrystalline spinel layer 16 can be smoothed by CMP. In some embodiments, the upper surface 16a of the polycrystalline spinel layer 16 can be smoothed so as to have a maximum surface roughness of about 2 nm or less. In some embodiments, the upper surface 16a of the polycrystalline spinel layer 16 can be smoothed so as to have a maximum surface roughness of about 1.5 nm or less. In such embodiments, the surface roughness of the upper surface 16a can have an average surface roughness of about 1 nm or less. The minimum surface roughness of the upper surface 16a of the polycrystalline spinel layer 16 can be about 0.1 nm in such embodiments. Accordingly, the preparing operation 10 can involve smoothing the upper surface 16a of the polycrystalline spinel layer 16 to a surface roughness in a range from 0.1 nm to 2 nm. The preparation operation 30 may be performed at the wafer level. In certain instances, surfaces of polycrystalline spinel layers on a same wafer can have different surface roughness.

In some other instances, the preparing operation 30 can include forming an adhesion layer on a surface of a piezoelectric layer and/or a ceramic support substrate (e.g., a polycrystalline spinel layer). The adhesion layer can be, for example, an oxide layer (e.g., $SiO_2$).

The manufacturing process 4 also includes a bonding operation 32 of bonding a polycrystalline spinel layer to a piezoelectric layer. For instance, the lower surface 10b of the LN layer 10 and the upper surface 16a of the polycrystalline spinel layer 16 can be bonded together. When the surfaces 10b, 16a are prepared for direct bonding, as explained above, the LN layer 10 and the polycrystalline spinel layer 16 can be bonded without an intervening adhesive. The surfaces 10b and 16a of the SAW resonator 1 can be directly bonded to each other by contact without applying an external pressure and/or heat.

The manufacturing process 4 also includes a thinning operation 34 of thinning a piezoelectric layer, such as the LN layer 10. In some embodiments, the LN layer 10 can be thinned by, for example, etching, lapping, grinding, planarization, polishing, etc. from the upper surface 10a. The bonding strength resulting from bonding the LN layer 10 and the polycrystalline spinel layer 16 should withstand the load applied during the thinning of the LN layer 10. The LN layer 10 can be thinned to have a suitable thickness. For example, the LN layer 10 can be thinned to have the thickness T1 in a range of, for example, 3L to 20L.

The manufacturing process 4 further includes an interdigital transducer (IDT) electrode forming operation 35 of forming an IDT electrode on the upper surface 10a of the LN layer 10. The IDT electrodes 12 can be formed by, for example, depositing the Mo layer 18 over the LN layer 10 and depositing the Al layer 20 over the Mo layer 18.

The manufacturing process 4 further includes a temperature compensation layer forming operation 36 of forming a temperature compensation layer over a piezoelectric layer. With a temperature compensation layer over a piezoelectric layer and the IDT electrode, a SAW resonator can be referred to as a temperature compensated SAW resonator. In an embodiment, the $SiO_2$ layer 14 can be formed over the LN layer 10 and in contact with the IDT electrode 12. The $SiO_2$ layer 14 may be formed by, for example, depositing $SiO_2$ over the LN layer 10. The formation of the $SiO_2$ layer 14 can control the thickness T2 of the $SiO_2$ layer 14. For example, $SiO_2$ can be deposited to have the thickness T2 in a range from 0.3L to 0.5L.

The manufacturing process 4 further includes a packaging operation 38 of packaging the SAW resonator. The packaging operation 38 can include thinning the polycrystalline spinel layer 16. In some embodiments, the polycrystalline spinel layer 16 can be thinned by way of grinding. For example, the polycrystalline spinel layer 16 can be thinned from the lower surface 16b of the polycrystalline spinel layer 16 after bonding the LN layer 10 and the polycrystalline spinel layer 16. The thickness T4 of the polycrystalline spinel layer 16 can be determined, for example, by a desired overall dimension of the SAW resonator 1 and/or by a thickness sufficient to maintain structural integrity of the polycrystalline spinel support substrate 16.

Figure 5B:
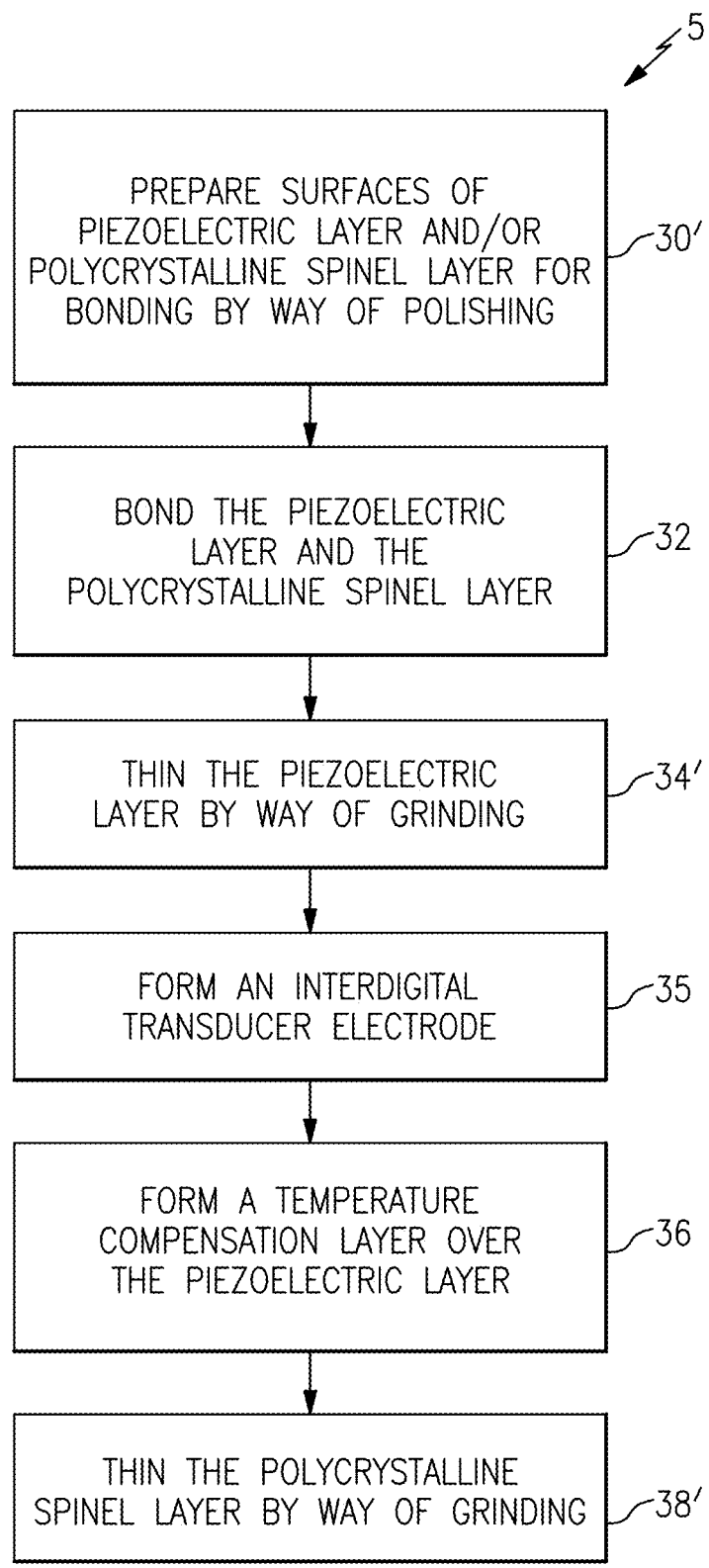
FIG. 5B is a flowchart that illustrates a manufacturing process of forming a surface acoustic wave resonator according to another embodiment.

FIG. 5B is a flowchart that illustrates a manufacturing process 5 of forming a SAW resonator. Unless otherwise noted, processes of FIG. 5B may be the same as or generally similar to like numbered processes in FIG. 5A.

The manufacturing process 5 includes a preparing operation 30' of preparing a surface of a piezoelectric layer and/or a ceramic support substrate (e.g., a polycrystalline spinel layer) for bonding by way of polishing. The surfaces 10b and/or 16a of the piezoelectric layer 10 and the polycrystalline spinel layer 16, respectively, can be polished by way of, for example, chemical-mechanical polishing (CMP).

The manufacturing process 5 also includes a thinning operation 34' of thinning a piezoelectric layer, such as the LN layer 10, by way of grinding. The LN layer 10 can be thinned to have a suitable thickness. For example, the LN layer 10 can be thinned to have the thickness T1 in a range of, for example, 3L to 20L.

The manufacturing process 5 further includes a thinning operation 38' of thinning the SAW resonator by way of grinding. The thinning operation 38 can include grinding the polycrystalline spinel layer 16. The thickness T4 of the polycrystalline spinel layer 16 can be determined, for example, by a desired overall dimension of the SAW resonator 1 and/or by a thickness sufficient to maintain structural integrity of the polycrystalline spinel support substrate 16.

Figure 5C:
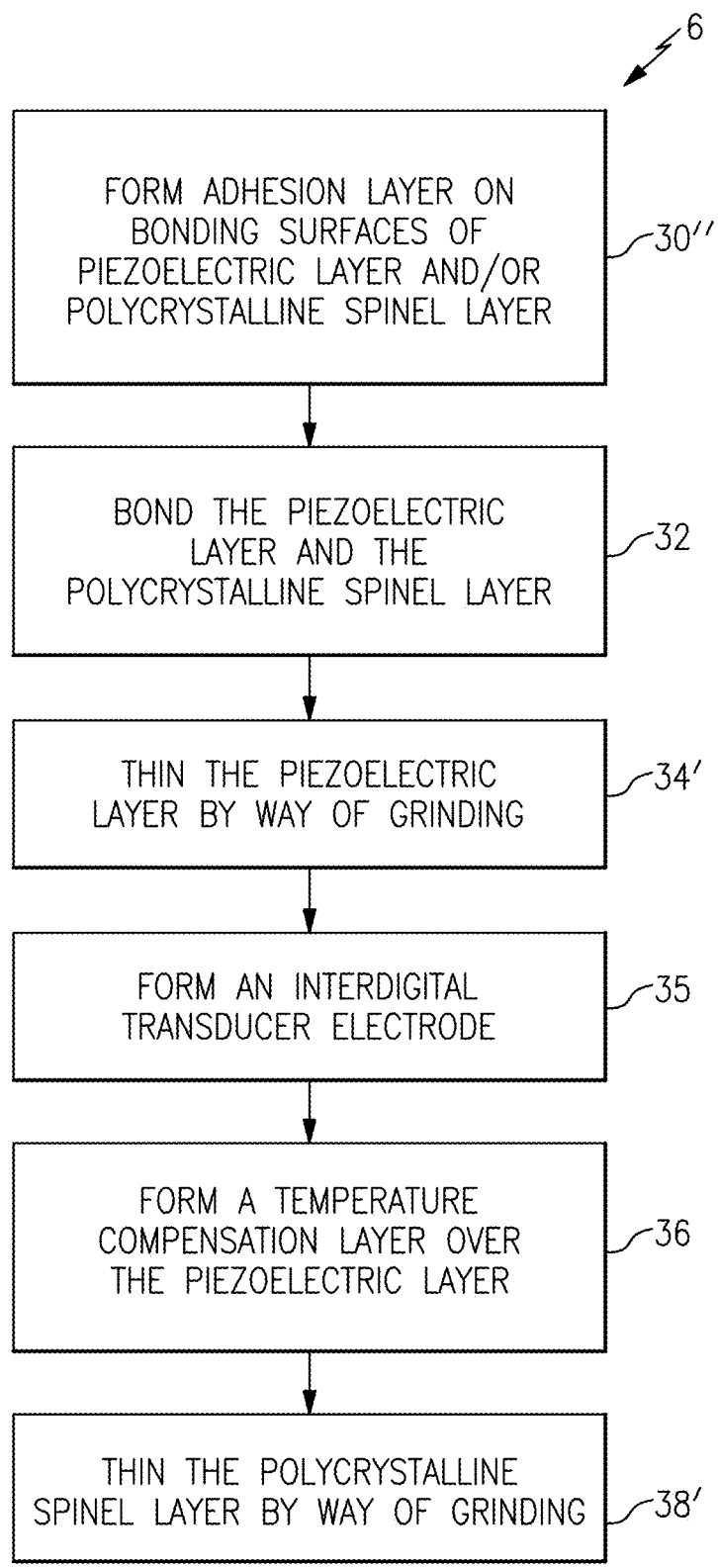
FIG. 5C is a flowchart that illustrates a manufacturing process of forming a surface acoustic wave resonator according to another embodiment.

FIG. 5C is a flowchart that illustrates a manufacturing process 6 of forming a SAW resonator. Unless otherwise noted, processes of FIG. 5C may be the same as or generally similar to like numbered processes in FIGS. 5A and 5B.

The manufacturing process 5 includes a preparing operation 30″ of preparing a surface of a piezoelectric layer and/or a ceramic support substrate (e.g., a polycrystalline spinel layer) for bonding by way of forming an adhesion layer on a surface of a piezoelectric layer and/or a ceramic support substrate (e.g., a polycrystalline spinel layer). The adhesion layer can be, for example, an oxide layer (e.g., $SiO_2$).

An MPS SAW resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS SAW resonators disclosed herein. FR1 can be from 410 MHz to 7.125 GHz, for example, as specified in a current 5G NR specification. In 5G applications, the thermal dissipation of the MPS SAW resonators disclosed herein can be advantageous. For example, such thermal dissipation can be desirable in 5G applications with a higher time-division duplexing (TDD) duty cycle compared to fourth generation (4G) Long Term Evolution (LTE). At the same time, the MPS SAW resonators disclosed herein can reduce back reflection from the support substrate and maintain a desirable frequency response at higher frequencies for a filter that includes the MPS SAW resonators. In 5G applications, this feature can help with meeting output of band specifications, for example, for carrier aggregation applications. One or more MPS SAW resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figure 6:
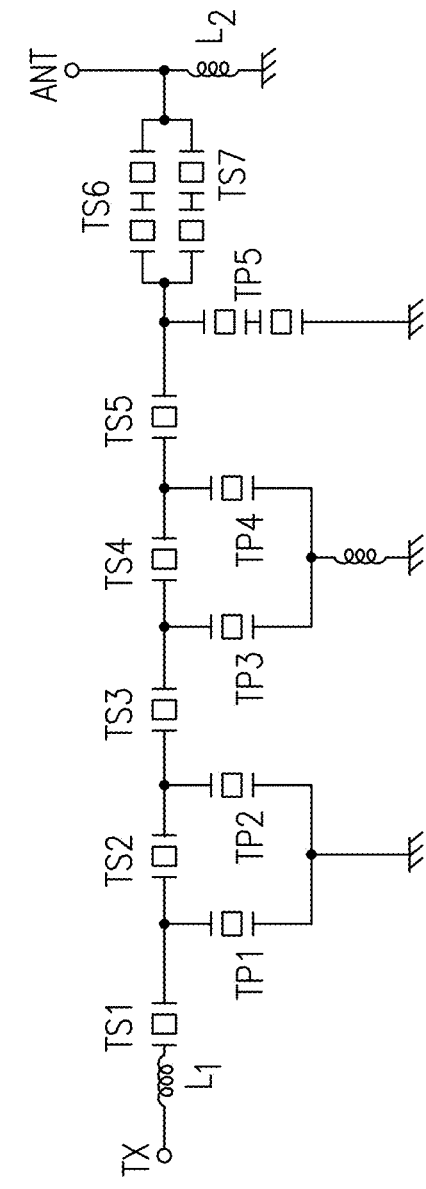
FIG. 6 is a schematic diagram of a transmit filter that includes a surface acoustic wave resonator according to an embodiment.

FIG. 6 is a schematic diagram of an example transmit filter 45 that includes surface acoustic wave resonators of a surface acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series SAW resonators TS1, TS2, TS3, TS4, TS5, TS6, and TS7, shunt SAW resonators TP1, TP2, TP3, TP4, and TP5, series input inductor L1, and shunt inductor L2. Some or all of the SAW resonators TS1 to TS7 and/or TP1 to TP5 can be a SAW resonators with a spinel substrate in accordance with any suitable principles and advantages disclosed herein. For instance, one or more of the SAW resonators of the transmit filter 45 can be a surface acoustic wave resonator 1 of FIG. 1A. Alternatively or additionally, one or more of the SAW resonators of the transmit filter 45 can be a surface acoustic wave resonator 2 of FIG. 2A. In certain instances, a SAW component in accordance with any suitable principles and advantages disclosed herein can include SAW resonators of two or more acoustic wave filters. Any suitable number of series SAW resonators and shunt SAW resonators can be included in a transmit filter 45.

Figure 7:
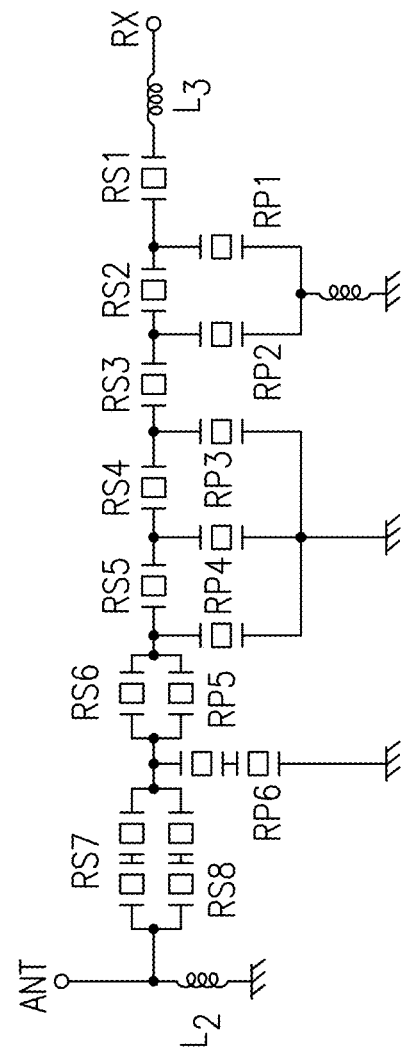
FIG. 7 is a schematic diagram of a receive filter that includes a surface acoustic wave resonator according to an embodiment.

FIG. 7 is a schematic diagram of a receive filter 50 that includes surface acoustic wave resonators of a surface acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series SAW resonators RS1, RS2, RS3, RS4, RS5, RS6, RS7, and RS8, shunt SAW resonators RP1, RP2, RP3, RP4, and RP5, and RP6, shunt inductor L2, and series output inductor L3. Some or all of the SAW resonators RS1 to RS8 and/or RP1 to RP6 can be SAW resonators with a spinel substrate in accordance with any suitable principles and advantages disclosed herein. For instance, one or more of the SAW resonators of the receive filter 50 can be a surface acoustic wave resonator 1 of FIG. 1A. Alternatively or additionally, one or more of the SAW resonators of the receive filter 50 can be a surface acoustic wave resonator 2 of FIG. 2A. Any suitable number of series SAW resonators and shunt SAW resonators can be included in a receive filter 50.

Figure 8:
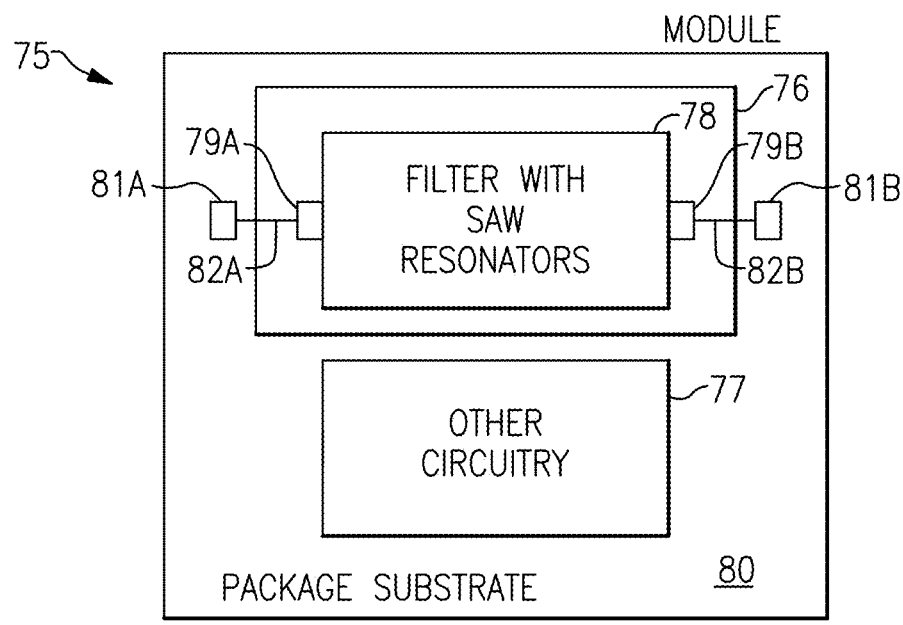
FIG. 8 is a schematic diagram of a radio frequency module that includes a surface acoustic wave component according to an embodiment.

FIG. 8 is a schematic diagram of a radio frequency module 75 that includes a surface acoustic wave component 76 according to an embodiment. The illustrated radio frequency module 75 includes the SAW component 76 and other circuitry 77. The SAW component 76 can include one or more SAW resonators with any suitable combination of features of the SAW resonators disclosed herein. The SAW component 76 can include a SAW die that includes SAW resonators.

The SAW component 76 shown in FIG. 8 includes a filter 78 and terminals 79A and 79B. The filter 78 includes SAW resonators. One or more of the SAW resonators can be implemented in accordance with any suitable principles and advantages of the surface acoustic wave resonator 1 of FIG. 1A and/or the surface acoustic wave resonator 2 of FIG. 2A. The terminals 79A and 78B can serve, for example, as an input contact and an output contact. The SAW component 76 and the other circuitry 77 are on a common packaging substrate 80 in FIG. 8. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

Figure 9:
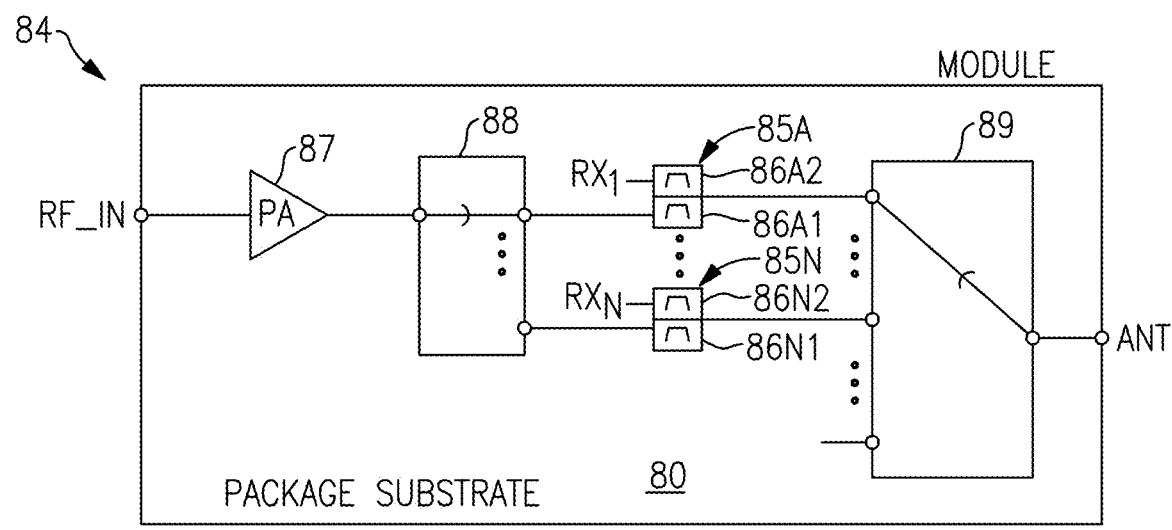
FIG. 9 is a schematic diagram of a radio frequency module that includes a surface acoustic wave component according to an embodiment.

FIG. 9 is a schematic diagram of a radio frequency module 84 that includes a surface acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more SAW resonators in accordance with any suitable principles and advantages disclosed herein. Similarly, one or more of the receive filters 86A2 to 86N2 can include one or more SAW resonators in accordance with any suitable principles and advantages disclosed herein. Although FIG. 9 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 10:
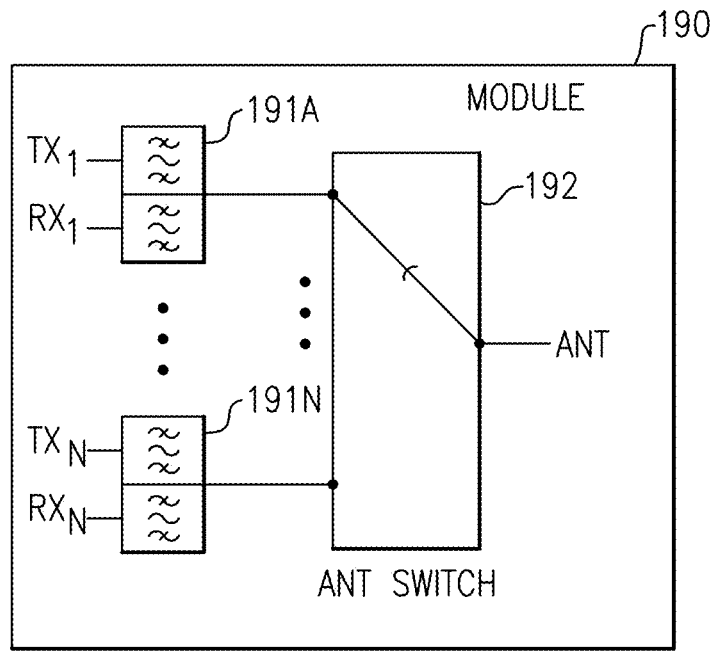
FIG. 10 is a schematic block diagram of a module that includes an antenna switch and duplexers that include a surface acoustic wave resonator according to an embodiment.

FIG. 10 is a schematic block diagram of a module 190 that includes duplexers 191A to 191N and an antenna switch 192. One or more filters of the duplexers 191A to 191N can include any suitable number of surface acoustic wave resonators in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 11A:
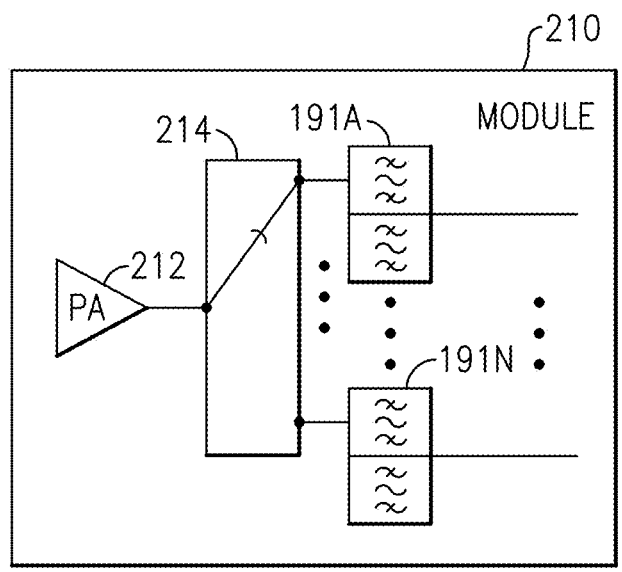
FIG. 11A is a schematic block diagram of a module that includes a power amplifier, a radio frequency switch, and duplexers that include a surface acoustic wave resonator according to an embodiment.

FIG. 11A is a schematic block diagram of a module 210 that includes a power amplifier 212, a radio frequency switch 214, and duplexers 191A to 191N in accordance with one or more embodiments. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators in accordance with any suitable principles and advantages discussed herein. Any suitable number of duplexers 191A to 191N can be implemented.

Figure 11B:
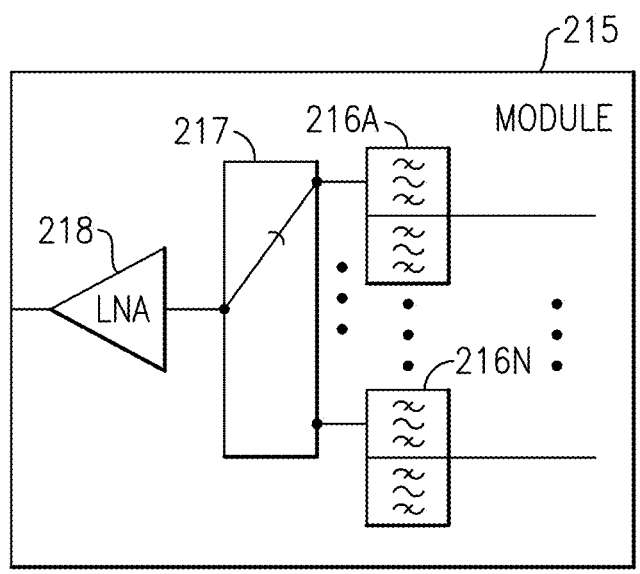
FIG. 11B is a schematic block diagram of a module that includes filters, a radio frequency switch, and a low noise amplifier according to an embodiment.

FIG. 11B is a schematic block diagram of a module 215 that includes filters 216A to 216N, a radio frequency switch 217, and a low noise amplifier 218 according to an embodiment. One or more filters of the filters 216A to 216N can include any suitable number of acoustic wave resonators in accordance with any suitable principles and advantages disclosed herein. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 12A:
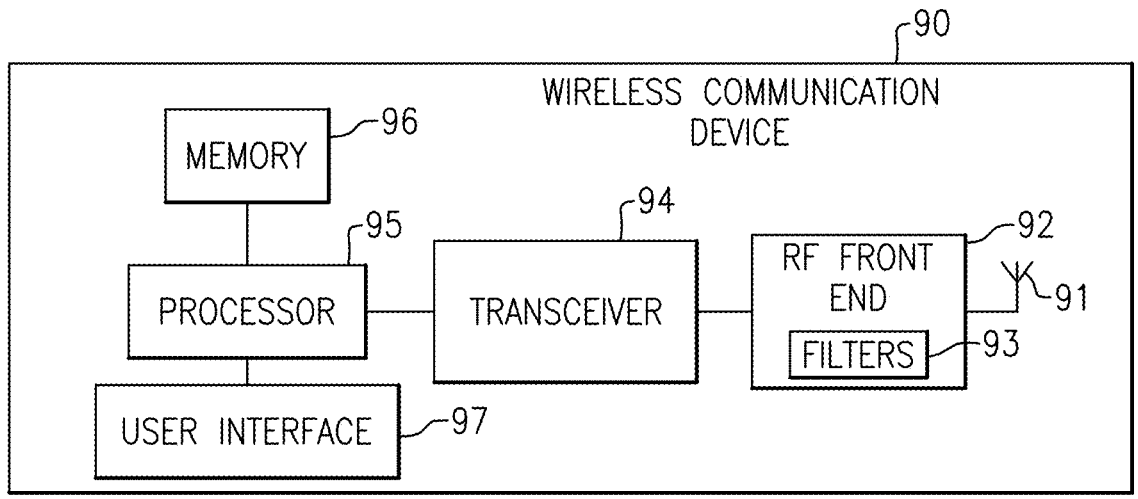
FIG. 12A is a schematic block diagram of a wireless communication device that includes a filter in accordance with one or more embodiments.

FIG. 12A is a schematic diagram of a wireless communication 90 device that includes filters 93 in a radio frequency front end 92 according to an embodiment. The filters 93 can include one or more SAW resonators in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include SAW resonators of a SAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 12B:
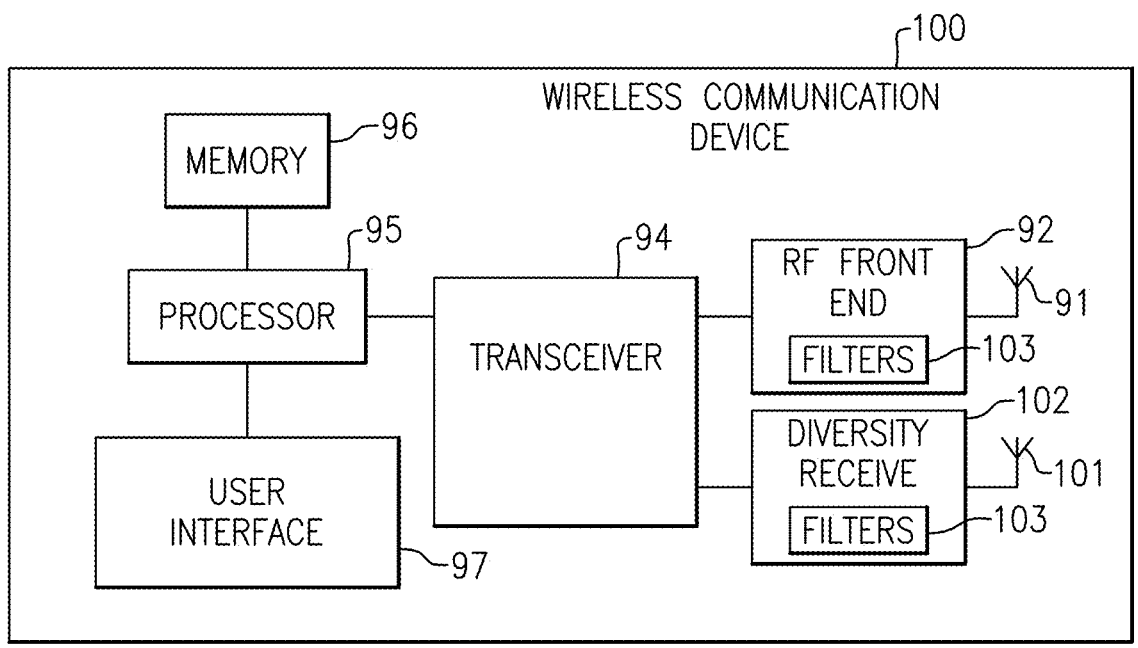
FIG. 12B is a schematic block diagram of another wireless communication device that includes a filter in accordance with one or more embodiments.

FIG. 12B is a schematic diagram of a wireless communication device 100 that includes filters 93 in a radio frequency front end 92 and a second filter 103 in a diversity receive module 102. The wireless communication device 100 is like the wireless communication device 90 of FIG. 12A, except that the wireless communication device 100 also includes diversity receive features. As illustrated in FIG. 12B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include one or more SAW resonators that include any suitable combination of features discussed with reference to any embodiments discussed above.

Although embodiments are discussed with reference to surface acoustic wave devices, any suitable principles and advantages disclosed herein can be applied to boundary acoustic wave devices, Lamb wave resonators, and/or other suitable acoustic resonators.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave device comprising:
a ceramic substrate having a scattering surface, the scattering surface enabling reduction of back reflection to improve frequency attenuation as compared to a non-scattering surface;
a piezoelectric layer over the scattering surface of the ceramic substrate, the piezoelectric layer having an interdigital transducer electrode area and a beam scattering area having a wavy or irregular pattern indicative of wave scattering at the scattering surface;
an interdigital transducer electrode disposed in the interdigital transducer electrode area of the piezoelectric layer; and
a temperature compensating layer over the interdigital transducer electrode, the surface acoustic wave device configured to generate a surface acoustic wave.

2. The surface acoustic wave device of claim 1 wherein the ceramic substrate is a polycrystalline spinel substrate.

3. The surface acoustic wave device of claim 2 wherein a surface of the polycrystalline spinel substrate has a maximum roughness of 2 nanometers or less.

4. The surface acoustic wave device of claim 2 wherein a surface of the polycrystalline spinel substrate has an average roughness of 1 nanometers or less.

5. The surface acoustic wave device of claim 1 wherein the surface acoustic wave has a wavelength of $\lambda$, and the piezoelectric layer has a thickness in a range from $3\lambda$ to $20\lambda$.

6. The surface acoustic wave device of claim 5 wherein the thickness of the piezoelectric layer is at least $5\lambda$.

7. The surface acoustic wave device of claim 1 wherein the temperature compensating layer is a silicon dioxide layer.

8. The surface acoustic wave device of claim 1 wherein the interdigital transducer electrode includes two layers.

9. The surface acoustic wave device of claim 8 wherein one of the two layers includes aluminum.

10. The surface acoustic wave device of claim 9 wherein the other of the two layers includes molybdenum.

11. The surface acoustic wave device of claim 1 wherein the piezoelectric layer includes lithium niobate.

12. The surface acoustic wave device of claim 1 further comprising an adhesion layer positioned between the ceramic substrate and the piezoelectric layer.

13. A surface acoustic wave device comprising:
a ceramic substrate having a scattering surface;
a piezoelectric layer over the scattering surface of the ceramic substrate, the piezoelectric layer having an interdigital transducer electrode area and a beam scattering area, a surface of the beam scattering area having a wavy or irregular pattern indicative of wave scattering at the scattering surface; and
an interdigital transducer electrode disposed in the interdigital transducer electrode area of the piezoelectric layer, the surface acoustic wave device configured to generate a surface acoustic wave having a wavelength λ, and the piezoelectric layer has a thickness in a range from 3λ to 20λ.

14. The surface acoustic wave device of claim 13 wherein the ceramic substrate is a polycrystalline spinel substrate.

15. The surface acoustic wave device of claim 13 wherein the thickness of the piezoelectric layer is at least 5λ.

16. The surface acoustic wave device of claim 13 wherein a surface of the ceramic substrate has a maximum roughness of 2 nanometers or less.

17. The surface acoustic wave device of claim 13 wherein a surface of the ceramic substrate has an average roughness of 1 nanometers or less.

18. The surface acoustic wave device of claim 13 further comprising a silicon dioxide layer over the interdigital transducer electrode.

19. The surface acoustic wave device of claim 13 further comprising an adhesion layer between the ceramic substrate and the piezoelectric layer.

20. A surface acoustic wave filter comprising:
a surface acoustic wave resonator including a ceramic substrate having a scattering surface, a piezoelectric layer over the scattering surface of the ceramic substrate, an interdigital transducer electrode over the piezoelectric layer, and a temperature compensating layer over the interdigital transducer electrode, the scattering surface enabling reduction of back reflection to improve frequency attenuation as compared to a non-scattering surface, the piezoelectric layer having an interdigital transducer electrode area and a beam scattering area having a wavy or irregular pattern indicative of wave scattering at the scattering surface; and
a plurality of additional acoustic wave resonators, the surface acoustic wave resonator and the additional acoustic wave resonators arranged to filter a radio frequency signal.

* * * * *